US008723187B2

(12) United States Patent
Mazellier

(10) Patent No.: US 8,723,187 B2
(45) Date of Patent: May 13, 2014

(54) INTEGRATED DIAMOND TRANSDUCTION PIXELIZED IMAGER DEVICE AND MANUFACTURING PROCESS

(75) Inventor: Jean-Paul Mazellier, Voiron (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 632 days.

(21) Appl. No.: 12/980,760

(22) Filed: Dec. 29, 2010

(65) Prior Publication Data

US 2011/0156055 A1    Jun. 30, 2011

(30) Foreign Application Priority Data

Dec. 30, 2009    (FR) .................................... 09 59670

(51) Int. Cl.
*H01L 31/028*    (2006.01)
*H01L 31/18*    (2006.01)

(52) U.S. Cl.
USPC ........................................... 257/77; 257/431

(58) Field of Classification Search
USPC ............................ 257/77, 431–448, E31.011
See application file for complete search history.

(56) References Cited

U.S. PATENT DOCUMENTS

| 5,352,897 | A | 10/1994 | Horikawa et al. | |
|---|---|---|---|---|
| 8,212,328 | B2 * | 7/2012 | Pyo ................. | 257/447 |
| 8,314,498 | B2 * | 11/2012 | Hutto et al. ..................... | 257/432 |
| 2012/0248580 | A1 * | 10/2012 | Matsugai et al. ............. | 257/621 |

OTHER PUBLICATIONS

Preliminary Search Report issued Jul. 29, 2010, in French Patent Application No. FR 0959670 (FA 733325).
S. Lagomarsino, et al., "New perspectives for the Silicon-On-Diamond material", 9$^{th}$ International Conference on Large Scale Applications and Radiation Hardness of Semiconductor Materials, XP002591611, (Proceedings of Science), Sep. 30, 2009, pp. 1-8.
J. Widiez, et al., "Fabrication of Silicon on Diamond (SOD) substrates by either the Bonded and Etched-back SOI (BESOI) or the Smart-Cut technology", Solid State Electronics, Elsevier Science Publishers, vol. 54, No. 2, XP026904429, Dec. 21, 2009, pp. 158-163.
R. Stone, et al., "CVD Diamond Pixel Development", IEEE Transaction Nuclear Science, vol. 49, No. 3, Jun. 2002, pp. 1059-1062.
T. Fritzsch, et al., "Packaging of Radiation and Particle Detectors", Electronic Components and Technology Conference, 2006, pp. 310-314.
W. Adam, et al., "The development of diamond tracking detectors for the LHC", Nuclear Instruments & Methods in Physics Research A 514, 2003, pp. 79-86.

(Continued)

*Primary Examiner* — Cuong Q Nguyen
(74) *Attorney, Agent, or Firm* — Oblon, Spivak, McClelland, Maier & Neustadt, L.L.P.

(57) ABSTRACT

Imaging device including several pixels, each pixel including at least:
  a portion of a diamond layer placed between a first and second electrode, and able to achieve transduction of photons and/or high energy particles radiation into an electrical signal.
  an electronic circuit for amplification and/or reading of the electrical signal, electrically connected to at least the first electrode and made in a portion of a semiconductor material layer having a thickness lower than or equal to around 1 μm and forming the surface layer of an SOD type substrate, also including the diamond layer and a dielectric layer placed between the diamond layer and the electronic circuit.

9 Claims, 8 Drawing Sheets

(56) References Cited

OTHER PUBLICATIONS

P. Bergonzo, et al., "CVD diamond-based semi-transparent beam-position monitors for synchrotron beamlines: preliminary studies and device developments at CEA/Saclay", Journal of Synchrotron Radiation 13, 2006, pp. 151-158.
U.S. Appl. No. 12/980,786, filed Dec. 29, 2010, Mazellier.
U.S. Appl. No. 13/055,793, filed Jan. 25, 2011, Mazellier, et al.

* cited by examiner

INTEGRATED DIAMOND TRANSDUCTION PIXELIZED IMAGER DEVICE AND MANUFACTURING PROCESS

TECHNICAL FIELD

The invention falls within the field of imaging devices for detecting and/or measuring photons and/or high energy particles radiation, for example, high energy X, UV, and gamma photons radiation, and/or high energy alpha particles or neutrons radiation.

The invention has applications in various technical fields, such as nuclear, medical imaging, security imaging, or even space imaging.

STATE OF THE PRIOR ART

Diamond is a material known for its abilities to detect photons and/or high energy particles radiation. Thus, some photons and/or high energy particles radiation detection devices use diamond as a transducer material for effecting such detection: Photons and/or high energy particles received, forming the interest signal, interact with the crystal lattice structure of the diamond, generating electron-hole pairs with a characteristic energy by 13 eV interaction.

The electrical carriers created are, then, collected with metallic electrodes in the detection device, creating an electrical signal between the electrodes that is representative of photons and/or high energy particles radiation.

Depending on the structure of the electrodes, it is possible to deduce, from the electrical signal measured between the electrodes, the energy of the entities (photons or particles) of the interest signal, the intensity of the radiation received, and, if the detector is a pixelated detector, meaning comprising several pixels formed from the diamond, the spatial modulation of the interest signal, the electrical signal measured between the electrodes of each pixel forming, in this case, the image of the interest signal for the pixel in question.

Figure 1:
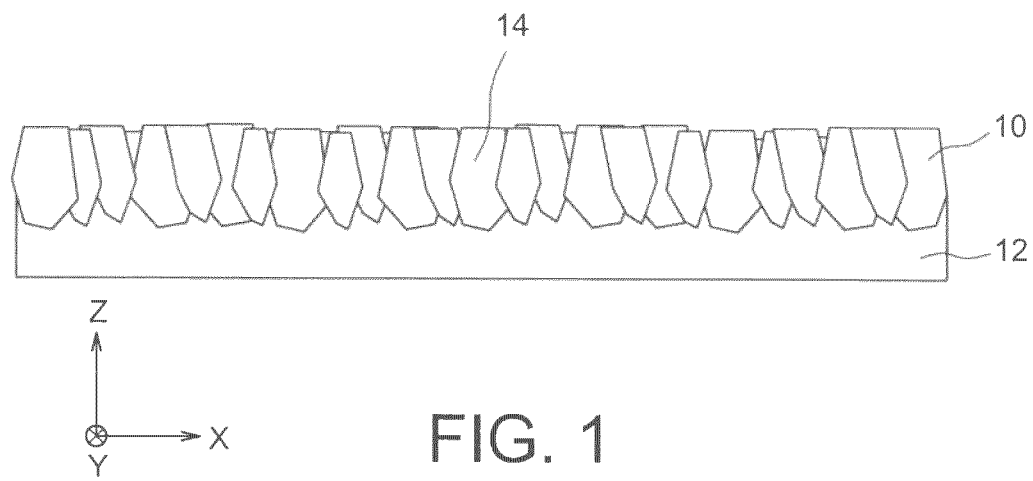

Several constraints are taken into consideration in the making of a pixelated detector:
  given that each pixel must be associated with an output (each pixel issuing an electrical signal), problems general occur with congestion in connection with the connectivity required to recover the signals from each pixel.
  in order to increase the detector's resolution, the size of the electrodes must be decreased, and an acceptable signal to noise ratio must be maintained. However, these two parameters contradict each other.
  for large detectors (e.g., larger than around 1 $mm^2$), it is necessary to use a synthetic diamond, for instance, of the CVD (chemical vapor deposited) type. Now, synthetic diamonds are generally formed on a heterosubstrate, meaning a substrate composed of a material other than diamond, which implies, considering the growth process used to form the diamond, that the diamond has a granular structure with development of grains in the direction of the thickness of the material (forming a column type diamond layer). FIG. 1 shows a polycrystalline CVD diamond layer 10 of this nature, formed on a substrate 12. As one can see in this FIG. 1, the diamond layer is formed by a multitude of grains 14, each one comprising a base (part located on the side of the substrate 12) with smaller dimensions in the plane (X, Y) than the rest of the grain. The shape of the grains can be roughly equated to a cone. Now, the base of the grains 14, which is part of the diamond layer 10 formed at the beginning of the growth of the diamond, meaning that which is located against the substrate 12, is, in general, electrically defective, and contributes to the noise intrinsic to an imaging device formed from a diamond layer 10.

The paper by R. Stone et al., titled "CVD Diamond Pixel Development", IEEE TRANSACTIONS ON NUCLEAR SCIENCE, VOL. 49, No. Jun. 3, 2002, describes a detector comprising a CVD diamond layer placed between several front electrodes (one for each pixel) and an rear electrode that is common to all of the pixels. The front electrodes are connected to an electronic reading circuit, which allows reading of the electrical signals sent to the front electrodes, using micro balls of welding material ("bumping").

A device of this nature, however, has several drawbacks:
  the minimum size of the electrodes is limited by that of the micro balls, which is significant (for example, around 125 µm),
  the micro balls generate extra thickness within the device,
  the homogeneity of the electrical responses received from the different electrodes, i.e., in different pixels, is not guaranteed, due to electrical variations that may be caused by the micro balls,
  the performance of these micro balls, considering the time and costs involved, is not good,
  the transfer of the diamond layer on the electronic reading circuit includes stages of manipulation of this layer, which is thin, and, which thus may cause deterioration of the diamond.

DESCRIPTION OF THE INVENTION

Thus there is a need to offer a pixelated imaging device that can detect and/or measure photons and/or high energy particles radiation, which doesn't have the same drawbacks as prior art, while taking into considering the constraints related to a pixelated imaging device, and which, especially, does not have the same problems related to the use of micro balls for attaching a diamond-based detection structure used for the transduction of the radiation measured and/or detected with an electronic circuit.

For this, one embodiment provides an imaging device comprising several pixels, each pixel comprising at least:
  a portion of a diamond layer placed between a first and second electrode, and able to achieve transduction of photons and/or high energy particles radiation into an electric signal,
  an electronic circuit for amplification and/or reading of the electric signal, electrically connected to at least the first electrode and made in a portion of a semiconductor material layer forming a surface layer of an SOD (semiconductor on diamond) type substrate, also including the diamond layer.

This imaging device, thus, uses a diamond layer physically connected to a semiconductor layer, with the two layers forming a single block.

The SOD substrate diamond layer serves as a transducer, converting the interest signal (photons and/or high energy particles) into an electrical signal, the semiconductor layer allowing the creation of an electronic circuit serving as an amplifier and/or reading of the electrical signal coming from the diamond layer.

The characteristics of the electrical signal issued by the electronic circuit may, then, be connected to those of the radiation intercepted by the diamond layer.

In this device, the diamond layer may play a role of shielding and preventing the photons and/or high energy particles ray from damaging the electronic circuit. For example, when the device intercepts a particles radiation, the diamond layer may have a thickness greater than or equal to around 15 μm, thus protecting the electronic circuitry.

Furthermore, unlike a semiconductor such as silicon, diamond has a low atomic number, resulting in a weak interaction of the diamond with high energy UV radiation and weak X rays.

Since diamond has a low response to visible light compared to high energy radiation ("solar blind"), there is no need to rework the images created with this imaging device in order to correct for parasitic phenomena, such as during spatial imagery.

Such a device may also be used to monitor certain characteristics of radiation passing through the device, in real time, such as in radiotherapy (photon X-ray) applications. For applications of this nature, the device may be configured so that every part of the device is weakly absorbent. In this case, we can choose to make the device with a diamond layer thinner or equal in thickness to about the absorption length of the diamond, which is defined according to the energy of the photons intercepted, and making metallic interconnections of the device, for example, composed of aluminum (a material that is semi-transparent to X-rays).

This device may also be used to detect alpha particles, especially in neutron detection applications in which a source of neutrons is used to irradiate an object to be studied (a truck trailer, for example). In this case, a screen is placed behind the object subject to study. To correlate the signal received on the screen with the start signal, the characteristics of which are unknown, we can use alpha type particles from the process of neutron generation.

Indeed, each neutron is associated with an alpha particle with a perfectly opposite moment (propagation in the opposite direction). Correlation of the neutron signal and the signal related to the alpha particles (measured by flight time) would then enable reconstruction of the initial structure of the studied object. This thickness of the diamond layer may, in this case, be around 10 μm.

This imaging device may also be used as a high energy neutron detector, the diamond having a better resistance to this type of radiation than silicon or a compound with a high atomic number.

The SOD-type substrate may also have a dielectric layer between the diamond layer and the electronic circuit. Such a dielectric layer would protect the diamond layer from high temperature oxygen flows used during the making of the electronic circuit while assuring an electrical insulation between diamond and semiconductor of the electronic circuit. This electrical insulation enables a better management of the important voltages applied on the device, and avoids operation problems due to these voltages.

The semiconductor layer material may have a thickness that is less than or equal to around 1 μm. Such thickness enables to limit interactions between the semiconductor and the received radiation, to reduce the possible degradation of the electronic circuit and the appearance of erroneous electrical signals at electrodes terminals. This thin layer enables also to make easier the making of the higher electrode and maximizes the electrical signal collection. The electronic circuit may also have one or more PD-SOI or FD-SOI type transistors.

Use of a very thin semiconductor material layer, for example, less than or equal to around 1 μm thick, allows creation of electronic circuit comprising devices, such as CMOS transistors with low consumption and which are resistant to photons and/or high energy particles radiation. Indeed, by minimizing the thickness of the semiconductor layer, we limit the interaction of the semiconductor with the radiation intercepted, thus reducing the risks of eventual deterioration of the electronic circuit and the appearance of erroneous electrical signals to the device's electrode terminals.

The first electrode and the electronic circuit may be placed side-by-side on a first face of the diamond layer. By "side-by-side", we mean that the projection of a section of the first electrode in the plane passing by the first side of the diamond layer does not overlap with the projection of a section of the electronic circuit on the same plane. In other words, the first electrode and the electronic circuit are not stacked one over the other.

In this case, the first electrode may have side walls that are at least partially covered by at least one dielectric material, and which may be substantially perpendicular to a lower wall of the first electrode placed against the first face of the diamond layer.

This dielectric material may, thus, electrically insulate the electrically conductive material of the electrode from the semiconductor material in which the electronic circuit is made, and which is located next to the electrode.

The imaging device may also have filtering means that can absorb radiation at wavelengths comprised between around 380 nm and 780 nm, arranged in front of a second face, opposite the first face, of the diamond layer. This filtering would, thus, allow protection of the electronic circuit from photons radiations in the visible range, and, thus, prevent these rays from causing a malfunction in the electronic circuit.

In one variant, the first electrode may be placed against the diamond layer, and between the electronic circuit and the diamond layer.

Thus, in this configuration, the first electrode of the imaging device is placed under the electronic circuit, which saves space in the device design.

The diamond layer may have a nucleation part on its first face, with the first electrode able to be partially placed in a recess formed in the nucleation part of the diamond layer. This configuration prevents the first electrode from being in contact with the nucleation part of the diamond layer, improving the homogeneity of the electrical contact between the diamond and the first electrode.

In one variant, the diamond layer may have a nucleation part located on a face opposite from that against which the first electrode is located. This variant allows for the nucleation part of the diamond layer to be on the side opposite that on which the first electrode is located.

The device may also have at least one passivation layer covering at least the electronic circuit, which is electrically connected to the first electrode using at least a portion of an electric interconnections layer located on the passivation layer and through vias made through at least the passivation layer and electrically connecting said portion of the electric interconnection layer to the electronic circuit and to the first electrode. The term "through via" means an interconnection hole filled with an electrically conductive material.

Another embodiment proposes a method for making an imaging device comprising several pixels, including, for each pixel, at least steps of:

making, in a portion of a semiconductor material layer forming the surface layer of an SOD-type substrate, also including a diamond layer, of an electronic circuit for amplification and/or reading of an electrical signal, making of a first electrode such that a portion of the diamond layer is placed between the first electrode and a second electrode, and, which can make a transduction of photons and/or particles radiation into an electrical signal, making of an electrical connection at least between the first electrode and the electronic circuit.

Another embodiment proposes a method for making an imaging device including several pixels, including, for each pixel, at least the steps of:

making, in a portion of a semiconductor material layer of a thickness lower than or equal to around 1 μm and forming the surface layer of an SOD type substrate, also including a diamond layer, of an electronic circuit for amplification and/or reading of an electrical signal, the substrate also including a dielectric layer placed between the diamond layer and the electronic circuit, making of a first electrode such that a portion of the diamond layer is placed between the first electrode and a second electrode, and, which can make transduction of photons and/or particles radiation into an electrical signal, making of an electrical connection at least between the first electrode and the electronic circuit.

The making of the first electrode may be achieved at least by implementation of the following steps:

a) deposition of a passivation layer covering the electronic circuit and the semiconductor material layer, b) making, in the passivation layer and the semiconductor layer, and next to the electronic circuit, of a cavity, c) deposition of a dielectric layer at least against the walls of the cavity, d) etching of part of the dielectric layer forming a bottom wall in the cavity, developing, or stripping, part of a first face of the diamond layer, e) making of a portion of an electrically conductive material placed in the cavity, against the first face of the diamond layer, forming the first electrode.

In one variant, the making of the first electrode may be achieved at least by implementation of the following steps:

a) making, in the semiconductor material layer, and next to the electronic circuit, of a cavity, b) deposition of a dielectric layer at least against the walls of the cavity, c) etching of part of the dielectric layer forming a bottom wall in the cavity, developing, or stripping, a part of a first face of the diamond layer, d) making of a portion of an electrically conductive material placed in the cavity, against the first face of the diamond layer, forming the first electrode, e) deposition of a passivation layer covering the first electrode, the electronic circuit, and the semiconductor material layer.

The dielectric layer may be placed between the first face of the diamond layer and the semiconductor layer, and in which the step d) of etching, or the step a) of making of the cavity, may also make the etching of a part of said dielectric layer placed on the bottom wall of the cavity.

The diamond layer may include a nucleation part located at the first face, and step c) or d) of etching may also make the etching of a nucleation part of the diamond layer located in the cavity.

The SOD-type substrate may comprise a layer composed of an electrically conductive material placed between the semiconductor layer and the diamond layer, the making of the first electrode may be achieved at least by implementation of etching of the semiconductor material layer and of the electrically conductive material layer according to a pattern consistent with that of the first electrode, the first electrode able to be located against the diamond layer and between the electronic circuit and the diamond layer.

The dielectric layer may be placed between the electrical conductor material layer and the semiconductor material layer, and, during the making of the first electrode, the dielectric layer may also be etched according to a pattern consistent with that of the first electrode, in such manner that the first electrode is placed against the diamond layer and between a remaining portion of the dielectric layer and the diamond layer.

The making process may include, also, the implementation, between the making of the first electrode and the making of the electrical connection, of a step of deposition of a planarization layer covering at least the electronic circuit and the first electrode.

The making of electrical connections between the first electrode and the electronic circuit may be achieved at least by the implementation of the following steps:

f) making of through vias electrically connected to the first electrode and to the electronic circuit at least through the passivation layer and/or the first electrode, g) making of an electrical interconnection layer on the passivation layer, such that at least part of the electrical interconnection layer and the through vias electrically connect the first electrode to the electronic circuit.

BRIEF DESCRIPTION OF THE DESIGNS

Figure 3:
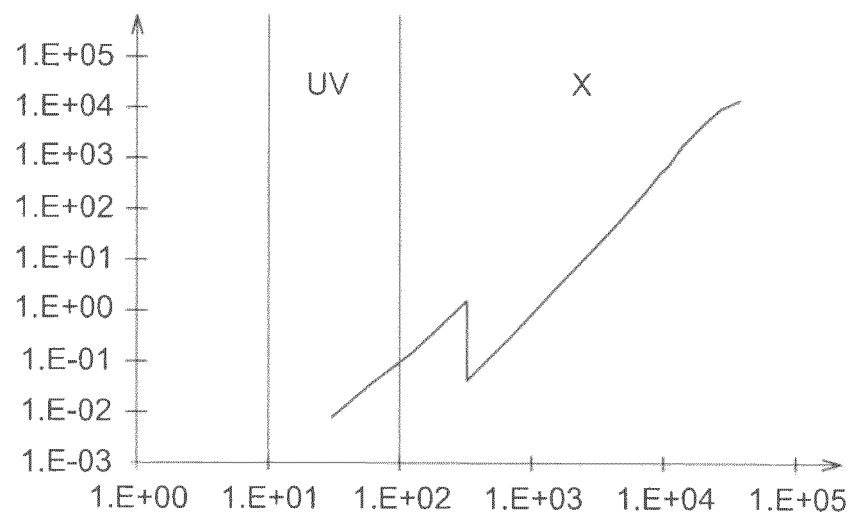
Figure 4:
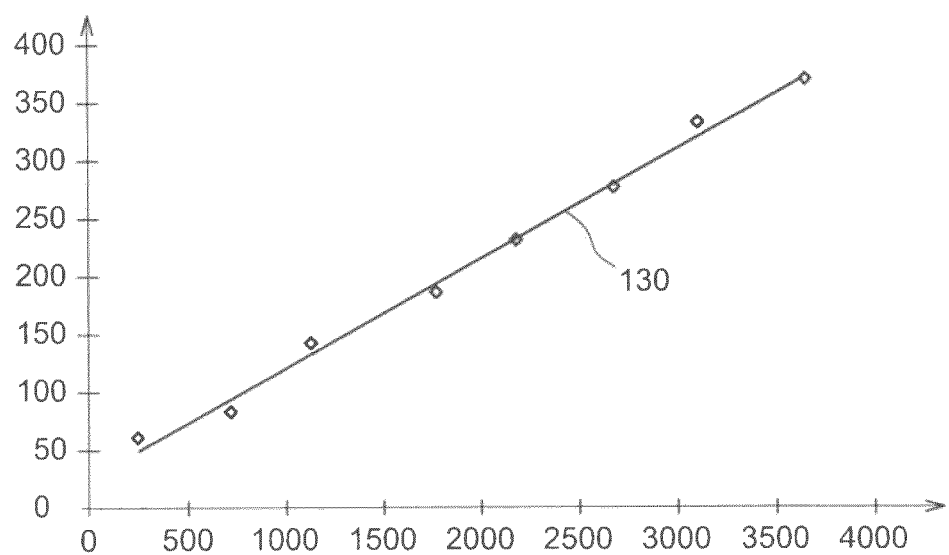
Figure 5:
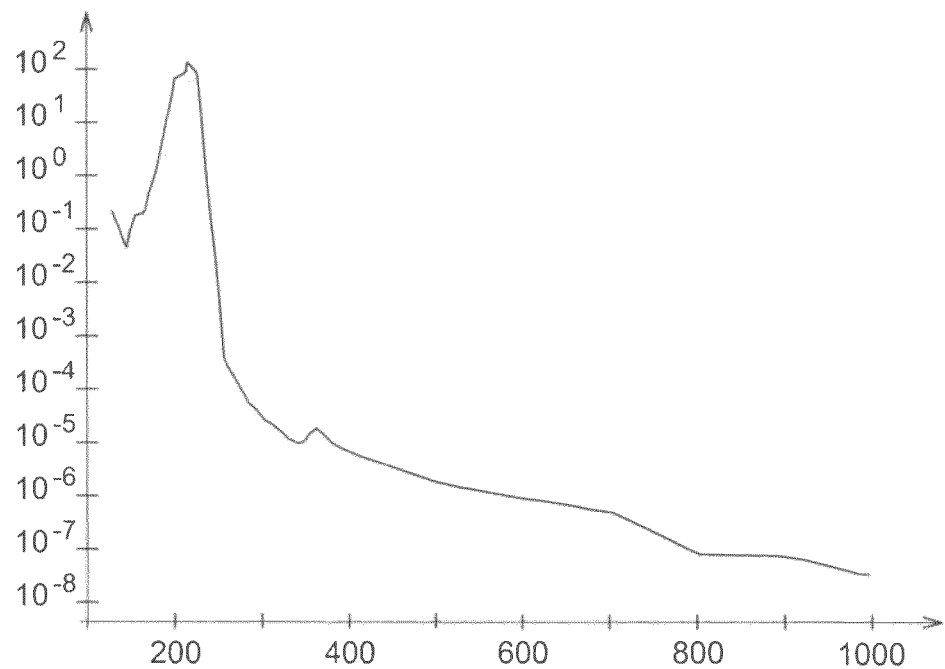
Figure 6:
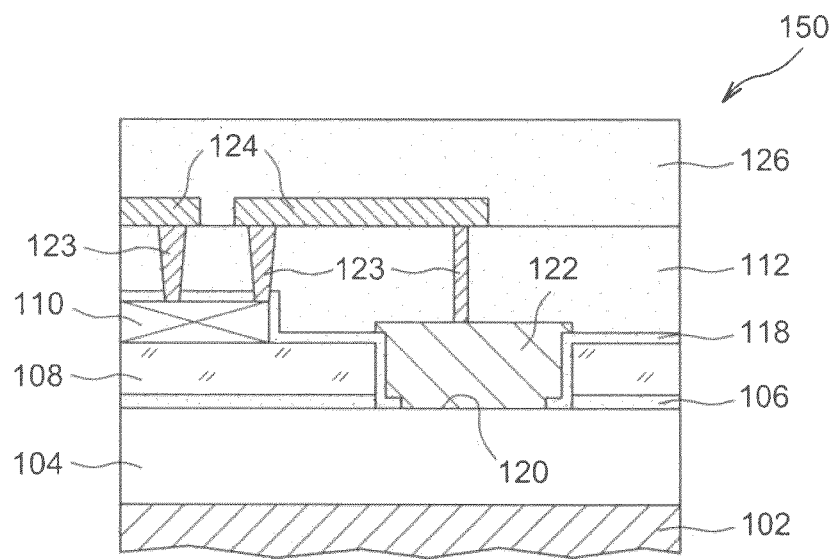

This invention will be best understood by reading the description of example constructions given for purely indicative purposes, and not limiting, making reference to the attached designs on which:

FIG. 1 shows a polycrystalline CVD diamond formed on a substrate,

FIGS. 2A to 2H show the steps in a process for production of an imaging device according to a first embodiment, FIG. 3 shows the absorption length of the diamond layer of the imaging device according to the energy of the photons intended to be detected by the imaging device, FIG. 4 shows the diameter of the grains of a polycrystalline diamond layer of an imaging device according to the thickness of the diamond layer, FIG. 5 shows the effective quantum efficiency of a polycrystalline CVD diamond layer of an imaging device according to the wavelength of the incident radiation intercepted by this diamond, FIG. 6 shows an imaging device according to a variant of the first embodiment, FIGS. 7A to 7E show the steps of a production process of an imaging device according to a second embodiment, Identical, similar, or equivalent parts from the different figures described below carry the same numerical references in order to facilitate transition from one figure to another.

The different parts shown in the figures are not necessarily shown to scale, uniformly, in order to make the figures more easily readable.

The various possibilities (variants and embodiments) must be understood as not being exclusive of each other, and able to be combined together.

DETAILED DESCRIPTION OF THE SPECIFIC EMBODIMENTS

First, we refer to FIGS. 2A to 2H, which represent the steps of a making process for a radiation imaging device 100 according to a first embodiment. In these FIGS. 2A to 2H, only the making of a part of the imaging device 100, corresponding to a pixel of the imaging device 100, is shown.

Figure 2A:
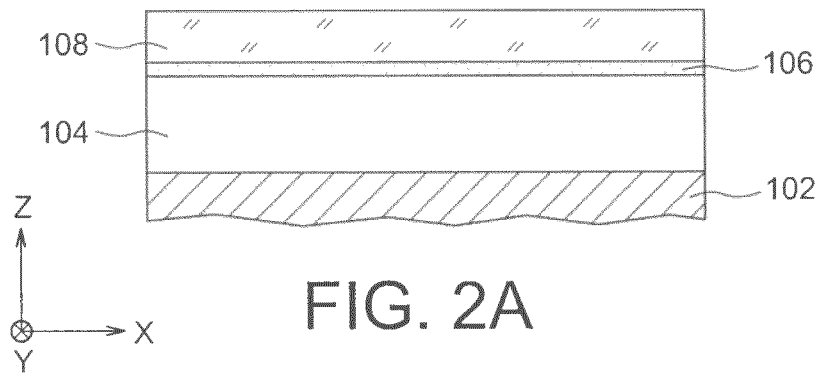

As shown in FIG. 2A, the imaging device 100 is made from an SOD-type substrate, meaning semiconductor on diamond type, having a back layer 102, or rear layer 102, a diamond layer 104, a barrier layer 106, and a surface layer 108 composed of a semiconductor (here, silicon).

The diamond layer 104 is placed between the back layer 102 and the barrier layer 106, and the barrier layer 106 is placed between the diamond layer 104 and the surface layer 108 composed of silicon.

The surface layer 108 is preferably a thin layer, with a thickness less than or equal to around 1 μm. The barrier layer 106 is composed of a dielectric material, such as a semiconductor oxide or a nitride of semiconductor, and has, for example, a thickness between around 100 nm and 1 μm.

The back layer 102 may be composed of an electrically conductive layer. In this case, the back layer 102 may be used directly as a rear electrode of the imaging device 100.

However, the back layer 102 may also be used as a support during the making of the imaging device 100, and be, for example, composed of a semiconductor. In this case, the back layer 102 is, upon completion of the process, replaced by an electrically conductive layer, for example, a metallic layer. It is also possible, if the back layer 102 is composed of a semiconductor material, to achieve doping thereof in order to make it electrically conductive, this forming, thus, the device's back electrode. We shall, however, first thin the back layer 102, in order for it to have a thickness of less than or equal to around 1 μm, in order not to disturb the flow.

Although it is not visible in FIG. 2A, the diamond layer 104, which has a granular structure similar to that of the diamond layer 10 shown in FIG. 1, has a nucleation part located on the side of the surface from which the growth of the diamond was produced.

This nucleation part may be located either on the side of the back layer 102, or the side of the barrier layer 106. If the diamond layer 104 is a polycrystalline diamond, this nucleation part is often very defective, due to a significant number of grain joints, graphite, etc.

These grain joints are a reducing factor on the electrical signal received when photons and/or high energy particles radiation is received by the diamond layer 104, due to interactions occurring between the electrical carriers created and the grain joints. Thus, the process described in connection with FIGS. 2A and 2H is preferably implemented from an SOD-type substrate in which the diamond layer 104 has a nucleation part located on the back layer 102 side and not on the side of the barrier layer 106, in order to limit the reduction of the electrical signal collected.

The diamond in the layer 104 may be of a polycrystalline CVD (chemical vapor deposited) type, HOD (highly oriented diamond) type, or intrinsic, mono-crystalline type.

The thickness of the diamond layer 104 will be selected according to the type of radiation that the imaging device 100 is intended to detect. Indeed, the absorption length of the diamond layer 104 is a function of the energy of the photons of the radiation received in the diamond.

The curve shown in FIG. 3 corresponds to the absorption length of the diamond, in μm, according to the energy of the photons received, in eV, here in the UV and X Ray field.

The thickness of the diamond layer 104 may, thus, be chosen greater than or equal to the absorption length of the photons and/or particles intended to be detected by the imaging device 100. However, for ease of implementation, it is possible for the thickness of the diamond layer 104 to be less than this absorption length, which may result in allowing a part of the radiation received to pass.

The steps for making such an SOD substrate are known in the state of the art, and are not, thus, detailed here.

Figure 2B:
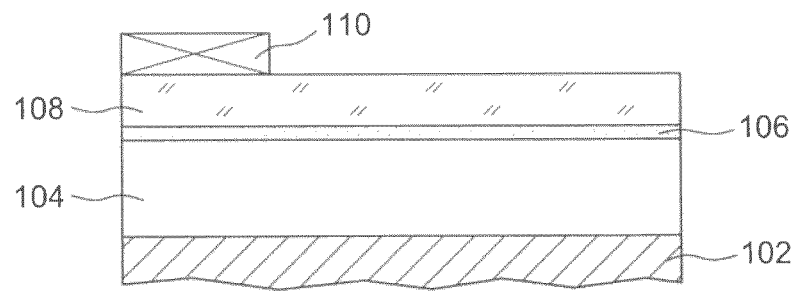

We then make, from the semiconductor layer 108, and for each pixel, an electronic circuit 110, forming, here, an amplifier for the electrical signal which will be received by the electrode terminals for the pixel when photons and/or particles radiation is received in the diamond portion of the pixel (FIG. 2B).

This electronic circuit 110 is, for example, similar to a CCD (Charged Coupled Device) or CMOS sensor amplification circuit. If the surface layer 108 is a thin layer, with a thickness of less than or equal to around 1 μm, the electronic circuit 110 may have elements, such as PD-SOI, that is partial depletion—silicon on insulator, or FD-SOI, that is full depletion—silicon on insulator, type transistors. Thus, by minimizing the thickness of the surface layer 108, we limit the effects of the interaction of the semiconductor of the surface layer 108 with the photons and/or high energy particles sent into the diamond layer 104, reducing, thus, the risks of possible deterioration of the electronic circuit 110 and the occurrence of errors in the collected electrical signal.

When making the electronic circuit 110, high temperature oxygen flows cross the surface layer 108, for example, during the oxidation stage of the semiconductor of the surface layer 108. The dielectric material of the barrier layer 106 protects the diamond layer 104 and the back layer 102 from these oxygen flows, which, in the absence of the barrier layer 106, will cause combustion of the diamond and irreversibly damage the diamond layer 104.

Figure 2C:
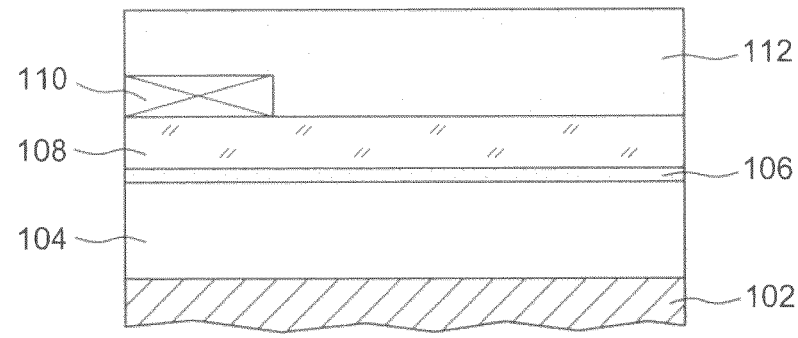

As shown in FIG. 2C, a first passivation layer 112 is then deposited on the electronic circuit 110, as well as on the remainder of the semiconductor surface layer 108. Partial etching of the first passivation layer 112 and, the semiconductor surface layer 108 is then implemented in order to form, in these two layers, a cavity 114 intended to house one of the electrodes of the imaging device 100.

Figure 2D:
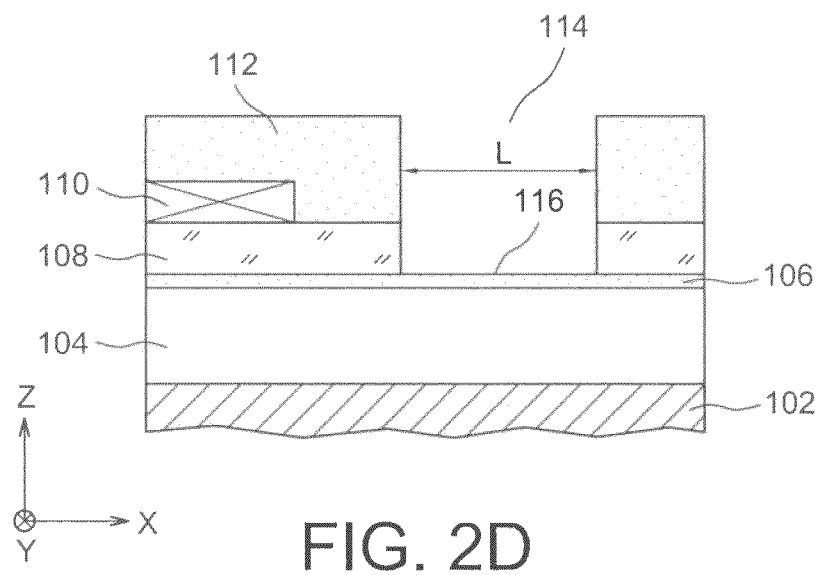

The section of the cavity 114, in the (X,Y) plane, has a substantially square shape here. This etching allows stripping part 116 of the surface of the barrier layer 106 (FIG. 2D).

The choice of the dimensions of the cavity 114, corresponding to the dimensions of the electrode intended to be built inside the cavity 114, is made depending on the thickness of the diamond layer 104. Indeed, the diamond of the layer 104 is polycrystalline, and, thus, by nature, not homogeneous (variable grain size). However the homogeneous character of the diamond is assessed on the scale of the size of the imaging device's 100 electrodes, since, if the diamond is consistent from one electrode to another, the imaging device's 100 pixels will give relatively similar responses for the same radiation received. Thus, the dimension L of one side of the electrode (dimension in the (X,Y) plane shown in FIG. 2D) of the imaging device 100 may be chosen such that $L = 5 \times D \times \sqrt{\pi}$, wherein D=diameter of a diamond grain.

Line 130, shown on FIG. 4, corresponds to the growth of the diameter of the diamond grains (in nm) according to the thickness (in nm) of the diamond layer 104. One sees, from this line 130, that the diameter D of the diamond grains grows linearly according to the thickness H of the diamond layer 104, such that: $D = A \ast H + B$.

The minimum size of an electrode may be chosen substantially equal to the thickness of the diamond layer. For example, for a diamond layer with a thickness equal to around 3.5 μm, the minimum L dimension of an electrode may be around 3.2 μm. Choosing the dimensions of the electrodes must, however, take into account other considerations, such as the minimum signal strength received by an electrode, the technological feasibility of producing tiny electrodes, etc.

Thus, in general, the dimensions of the electrode may be chosen such that around 100 grains are present under the electrode for one pixel of the imaging device 100, thereby maximizing the homogeneity of the responses from the imaging device 100.

Figure 2E:
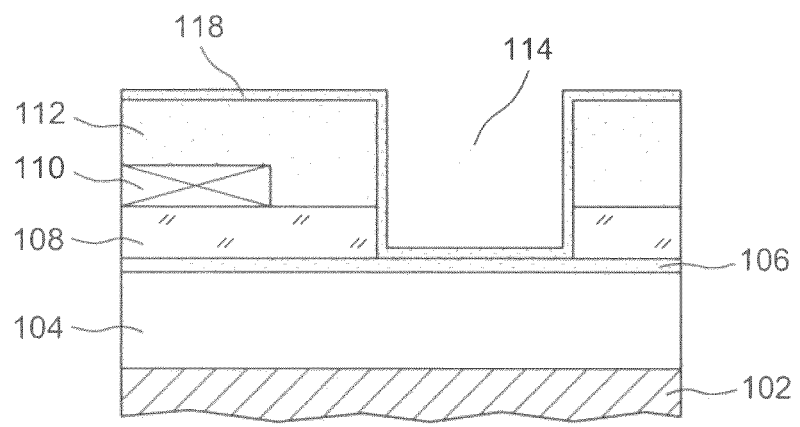

In order to electrically insulate the semiconductor of the surface layer 108 of the electrode intended to be made in the cavity 114, we deposit a dielectric layer 118 on the first passivation layer 112, and on the walls of the cavity 114, covering, thus, the side walls of the cavity 114, as well as the part 116 of the surface of the barrier layer 106 forming the bottom wall of the cavity 114 (FIG. 2E).

Figure 2F:
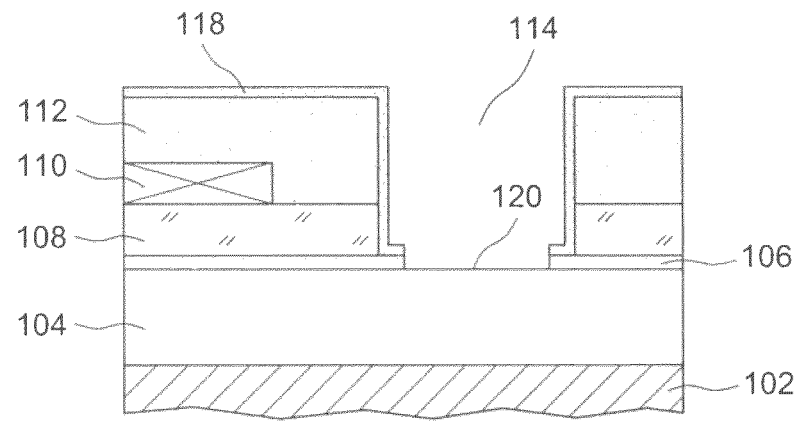

As shown in FIG. 2F, we then etch portions of the dielectric layer 118 and the barrier layer 106, located on the bottom wall of the cavity 114, developing a part 120 of the surface of the diamond layer 104, which then forms the bottom wall of the cavity 114. When the SOD substrate used to create the imaging device 100 has a diamond layer 104 including a nucleation part located on the side of the barrier layer 106 (nucleation part located, then, on the side of the bottom wall of the cavity 114), it is possible to make a partial etching of the diamond layer 104, in order to remove the nucleation part of the diamond layer 104 forming the bottom wall of the cavity 114.

Thus, the removal of the nucleation part at the contact electrode intended to be formed in the cavity 114 enables us to increase the distance for collection of charges generated in the diamond, thus improving the imaging device's 100 electrical performance.

In removing the nucleation part of the diamond layer at the bottom wall of the cavity 114, we should ensure that the remaining thickness of the diamond is sufficient to perform the desired absorption of photons and/or high energy particles, while preserving its homogeneity under the electrode, and that in order to prevent rendering regions of the diamond layer to be of much better quality than others, which would degrade system response in terms of homogeneity.

Figure 2G:
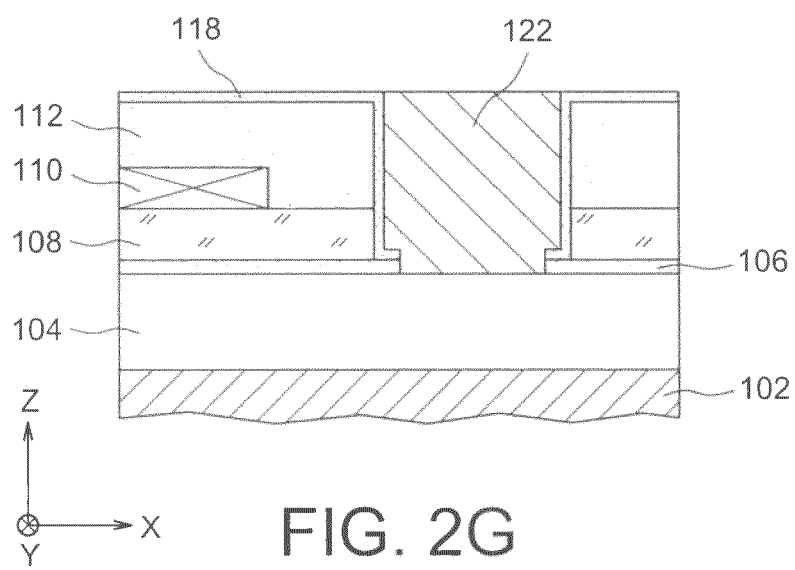
Figure 2H:
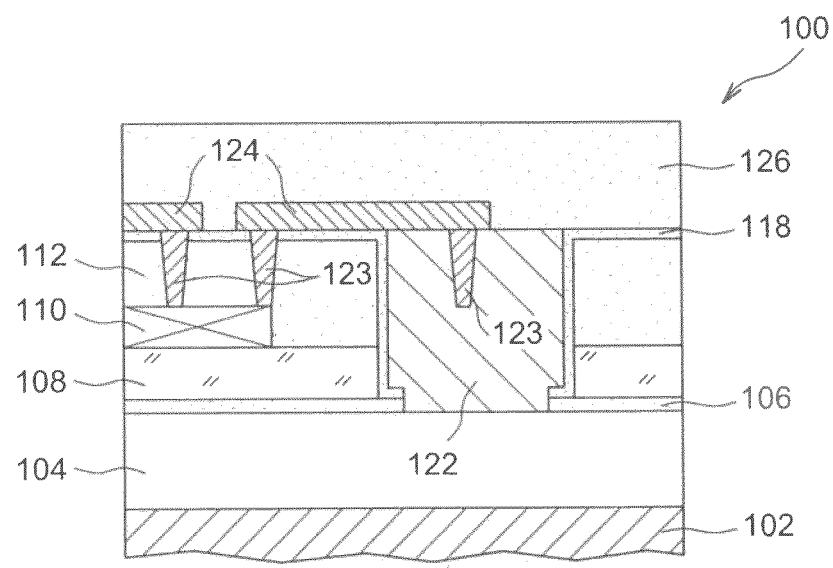

Next, we deposit an electrically conductive material, such as a carbonaceous (carbide, graphite, doped diamond) or metallic material, in the cavity 114 and on the dielectric layer 118. This electrically conductive layer is then planarized to form an electrode 122 (FIG. 2G). This planarization is, for example, achieved by performing a CMP (chemical mechanical polishing) of the electrically conductive layer, using the dielectric layer 118 as a stop layer.

We then make through vias 123 with an electrically conductive material through the passivation layer 112 and the dielectric layer 118, and in the electrode 122, in order to electrically connect the electronic circuit 110 and the electrode 122. Then, an electrical interconnection layer 124, possibly made of aluminum and/or another suitable, electrically conductive material, is formed on the passivation layer 112, allowing electrical connection, through the previously made vias 123, of the electrode 122 to the electronic circuit 110. The electrical interconnection layer 124 is then covered by a second passivation layer 126 (FIG. 2H).

When the back layer 102 is composed of an electrically conductive material, this layer can be preserved in order to form the rear electrode of the imaging device 100, which is for example common to all of the imaging device's 100 pixels. On the other hand, if the back layer 102 is made of a non-conductive material, it is then replaced by an electrically conductive layer forming the rear electrode of the imaging device 100.

In this imagine device 100, the diamond in the layer 104 placed between the electrode 122 and the rear electrode (formed by the back layer 102 in the example shown in FIG. 2H) thus forms a good transducer, generating electrical charges when the diamond receives photons and/or high energy particles radiation. Indeed, contrary to silicon, the diamond is able to reject visible and infrared light at a high rate, as shown in FIG. 5, in which the effective quantum efficiency is graphed, meaning the number of electrons generated by the incident radiation on a polycrystalline CVD diamond layer, according to the wavelength of the radiation received, expressed in nm, for a polarization electrical field E=28 KV/cm applied between the electrodes of the imaging device 100.

In the imaging device 100, the field characteristic of polarization may be equal to around 1 V/μm in the diamond's high resistivity zone.

It will, therefore, be necessary to polarize the imaging device 100 on the rear electrode rather than on electrode 122, in order to prevent the electronic circuit 110 from being exposed to high voltages.

Although not shown in FIG. 2H, the electronic circuit 110 of the imaging device 100 is electrically connected to other electronic circuits for reading and processing, which enable the application of various processing functions on the electrical circuits amplified by the electronic circuits built in the imaging device 100.

Thus, the electronic circuit 100 amplifies the signal coming from the diamond layer 104, and transmits it, either by CCD (transfer charges from the exterior reading circuit), or by matrix reading in the case of an electronic circuit 110 of the CMOS type, to a reading circuit external to the imaging device 100, reducing, thus, occurrence of extrinsic noise in the measurement and increasing the signal to noise ratio for a given electrode size. In one variant, it is possible for the electronic circuit 110 of the imaging device 100 not to produce only the amplification of the electrical signal generated in the diamond layer, but, also a reading of this signal, or even other processing functions, according to the available space in the imaging device 100.

Although not shown in FIG. 2H, the imaging device 100 may include a filter located before the back layer 102, enabling filtering of the radiation in the visible spectrum and, thus, preventing visible light from crossing the diamond layer 104 and interacting with the electronic circuit 110, and, thus, preventing proper functioning thereof.

FIG. 6 shows an imaging device 150 according to a variant of the imaging device 100 previously described.

The making of the imaging device 150 is achieved by first implementing the steps described above for FIGS. 2A and 2B in order to create an electronic circuit 110 formed by the semiconductor layer 108, itself, located on the barrier layer 106, the diamond layer 104, and the back layer 102.

Then, we etch layers 108 and 106 in order to form a cavity intended to receive one of the electrodes of the imaging device 150. The dielectric layer 118 is then deposited in this cavity, as well as on the electronic circuit 110 and on portions of the layer 108 located on the side of the cavity. We then etch a portion of the dielectric layer 118 located at the bottom of the cavity in order to strip, or develop, the part 120 of the surface of the diamond layer 104, which forms a bottom wall in the cavity.

The electrode 122 is then made, for example, by depositing an electrically conductive material and etching it, electrode 122 being placed in the cavity in contact with the part 120 of the diamond layer 104.

Then we deposit the passivation layer 112 on all of the previously built elements. Finally, similar to imaging device 100, we make through vias 123, the electrical interconnections layer 124, and the second passivation layer 126.

Compared to imaging device 100, this imaging device 150 has the advantage of being technologically simpler to produce.

Now, we refer to FIGS. 7A to 7E, which refer to the steps of a making process of a radiation imaging device 200, according to a second embodiment. In these FIGS. 7A to 7E, only the making of part of the imaging device 200, corresponding to one pixel of the imaging device 200, is shown.

Figure 7A:
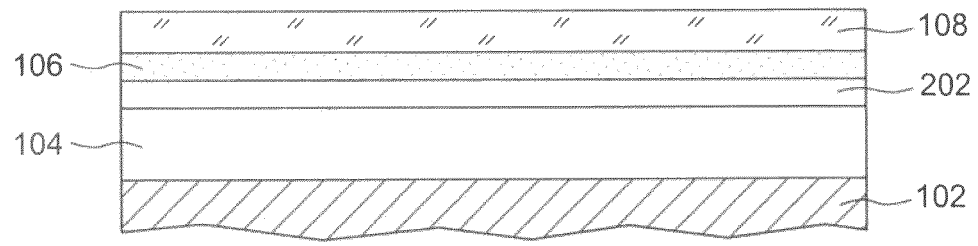
Figure 7B:
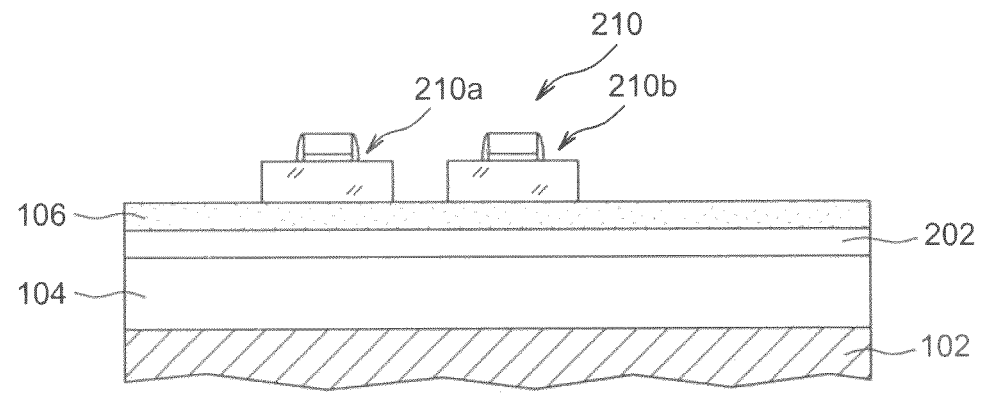

As shown in FIG. 7A, we make imaging device 200 from an SOD type substrate, similar to the substrate used for making the imaging device 100 described above, including the back layer 102, the diamond layer 104, the barrier layer 106, and the surface, semiconductor layer 108.

Layers 102, 104, 106, and 108 of this substrate are, for example, of similar dimensions and nature to the same layers described above for FIG. 2A. However, the SOD substrate used here also includes an electrically conductive layer 202, possibly made of tungsten and/or platinum and/or titanium and/or a carbonaceous material, possibly doped diamond, and/or another electrically conductive material which doesn't deteriorate when exposed to the high temperatures involved in the making of the electronic circuit of the imaging device 200, and of a thickness between around 50 nm and 100 nm, placed between the diamond layer 104 and the barrier layer 106. Furthermore, the diamond layer 104 may include a nucleation part located either, preferably, on the side of the back layer 102, or, possibly on the side of the electrically conductive layer 202.

Then, in parts of the semiconductor layer 108, we make electronic circuits, such as electronic circuit 110, described above for imaging device 100, forming amplification and/or reading circuits for the electrical signal that will be received when photons and/or particles radiation is received by the imaging device 200. On FIG. 7B, two CMOS transistors, 210a, 210b of the electronic circuit 210 are shown.

Each pixel of the imaging device 200 includes at least one electronic circuit similar to electronic circuit 210. As for imaging device 100, it is possible for electronic circuit 210 to include elements, such as PD-SOI or FD-SOI transistors, if the thickness of the semiconductor layer 108 allows it (thickness, for example, of less than 1 μm).

Figure 7C:
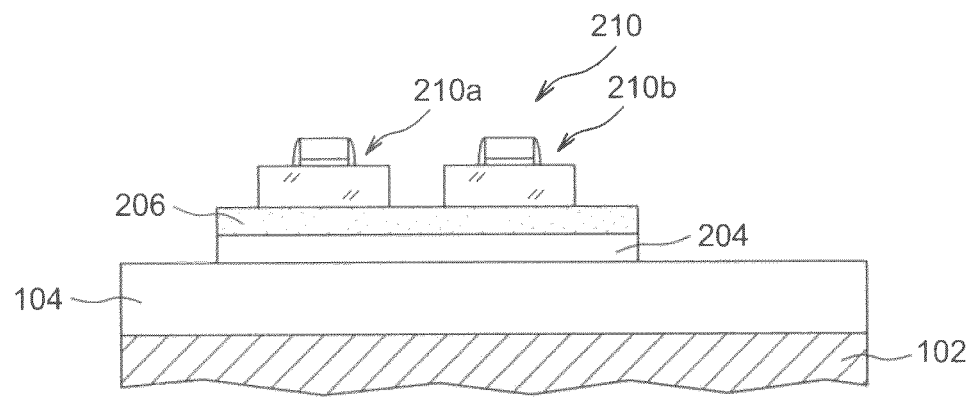

As shown in FIG. 7C, we then etch the electrically conductive layer 202 and the barrier layer 106 according to a pattern consistent with that of the electrode of the pixel of the imaging device 200. Thus, on the example in FIG. 7B, the remaining portion 204 of the electrically conductive layer 202 forms an electrode of the pixel of the imaging device 200 shown.

This etching also forms a remaining portion of 206 of the barrier layer 106, which is superimposed on the electrode 204. The design of the electrode 204 may be calculated in a manner similar to that previously described in connection with the imaging device 100, especially depending on the thickness of the diamond layer 104, which is, itself, a function of the absorption length of the diamond according to the particles which the imaging device 200 is intended to detect.

Figure 7D:
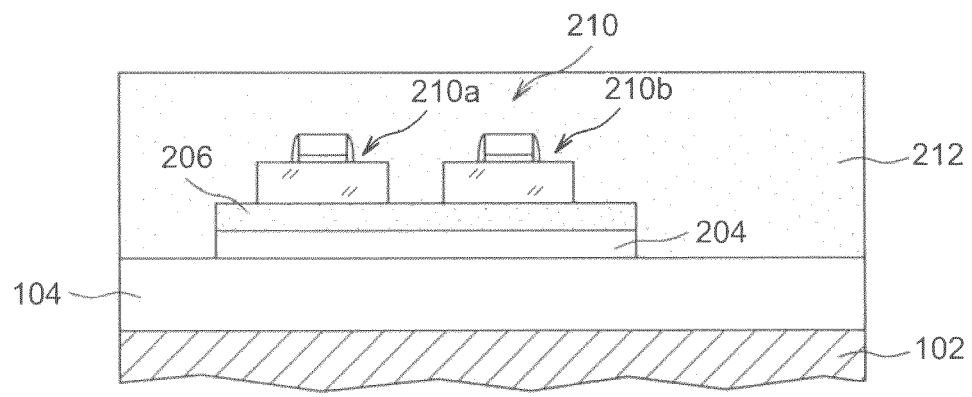

As shown in FIG. 7D, a first passivation layer 212 is then deposited on the previously constructed elements.

As for imaging device 100, we then create through vias 224, through the passivation layer 212, enabling electrical connection of the electronic circuit 210, as well as the electrode 204 (the via also crosses the remaining portion 206 of the barrier layer), as well as an electrical interconnection layer 224, made, for example, of aluminum and/or any other appropriate electrically conductive material, enabling electrical connection of electrode 204 to electronic circuit 210.

Figure 7E:
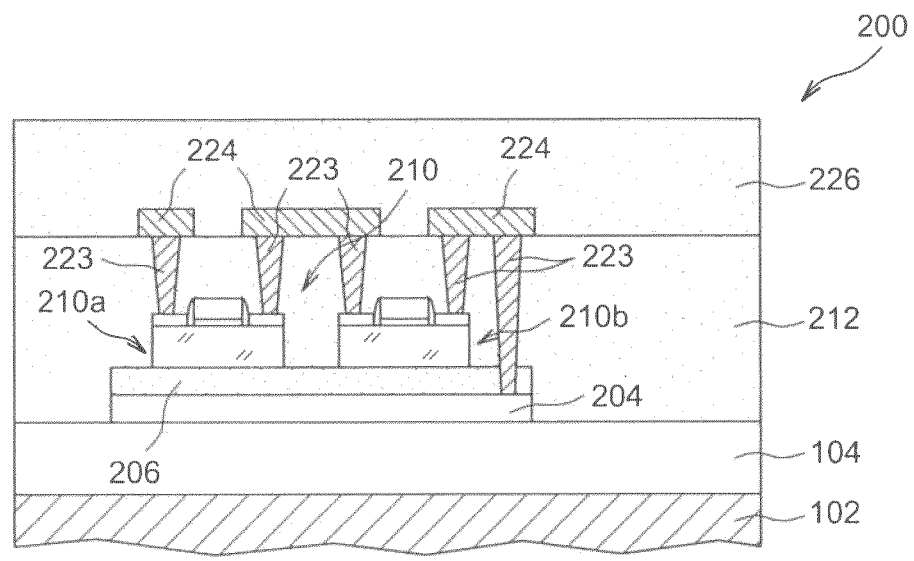

The electrical interconnections layer 224 may also be covered by a second passivation layer 226 (FIG. 7E).

Compared to imaging device 100, imaging device 200 includes, here, an electrode 204, placed under the electronic circuit 210. Thus, electrode 204, in addition to its role as an electrode enabling the diamond in layer 104 to play its transducer role, allows protection of electronic circuits 210a and 210b from the visible light spectrum, since this light spectrum may be absorbed by electrode 204, particularly when it is made of metal, thereby avoiding the need for an additional filter for the imaging device 200 on the side of the back layer 102. When electrode 204 is composed of a doped semiconductor, this electrode may have a thickness greater than or equal to around a few microns, such as 2 μm, in order for it to absorb radiation in the visible spectrum. Furthermore, this superimposition of electrode 204 and electronic circuit 210 also provides additional space in relation to imaging device 100.

The different variants described above, in association with imaging device 100 (rear electrode formed by the back layer 102 or one back electrode transferred later instead of the back layer 102, electronic circuit for amplification and/or reading of the signal at the electrode level) may also be applied to imaging device 200.

The invention claimed is:

1. An imaging device comprising:
    a plurality of pixels, each of the plurality of pixels including at least:
        a portion of a diamond layer placed between a first and a second electrode, and configured to achieve transduction of photons and/or high energy particles radiation into an electric signal, and
        an electronic circuit for amplification and/or reading of the electric signal, electrically connected to at least the first electrode and made in a portion of a semiconductor material layer having a thickness lower than or equal to 1 μm and forming the surface layer of an SOD type substrate, also including the diamond layer and a dielectric layer placed between the diamond layer and the electronic circuit.

2. The imaging device according to claim 1, in which the electronic circuit includes one or more transistors of PD-SOI or FD-SOI type.

3. The imaging device according to claim 1, in which the first electrode and the electronic circuit are placed side-by-side at a level of a first face of the diamond layer.

4. The imaging device according to claim 3, in which the first electrode includes side walls at least partially covered by a dielectric material, said side walls being substantially perpendicular to a lower wall of the first electrode placed against the first face of the diamond layer.

5. The imaging device according to claim 3, further comprising:
    filtering means for absorbing radiation at wavelengths comprised between 380 and 780 nm and placed in front of a second face, opposite the first face, of the diamond layer.

6. The imaging device according to claim 1, in which the first electrode is placed against the diamond layer, and between the electronic circuit and the diamond layer.

7. The imaging device according to claim 3, in which the diamond layer includes a nucleation part located on the first face, the first electrode being partially placed in a recess formed in the nucleation part of the diamond layer.

8. The imaging device according to claim 1, in which the diamond layer includes a nucleation part, located on one face opposite that against which the first electrode is placed.

9. The imaging device according to claim 1, further comprising:
at least one passivation layer covering at least the electronic circuit, which is electrically connected to the first electrode through at least a portion of an electrical interconnections layer located on the passivation layer and through vias made through at least the passivation layer and electrically connecting the portion of the electrical interconnection layer to the electronic circuit and to the first electrode.

* * * * *